United States Patent [19]

Ngan et al.

[11] Patent Number: 5,697,427

[45] Date of Patent: Dec. 16, 1997

[54] APPARATUS AND METHOD FOR COOLING A SUBSTRATE

[75] Inventors: Kenny King-Tai Ngan, Fremont; Dan Marohl, San Jose, both of Calif.

[73] Assignee: Applied Materials, Inc., Santa Clara, Calif.

[21] Appl. No.: 576,953

[22] Filed: Dec. 22, 1995

[51] Int. Cl.$^6$ .................................................. F28F 7/00
[52] U.S. Cl. .................... 165/80.1; 165/80.2; 118/728; 156/345
[58] Field of Search ..................... 165/80.1, 80.2, 165/185; 118/724, 725, 728; 156/345

[56] References Cited

U.S. PATENT DOCUMENTS

| | | |
|---|---|---|
| H1145 | 3/1993 | Anderson . |
| 3,711,081 | 1/1973 | Cachon . |
| 4,189,230 | 2/1980 | Zasio . |
| 4,542,298 | 9/1985 | Holden . |
| 4,671,204 | 6/1987 | Ballou . |
| 4,909,314 | 3/1990 | Lamont, Jr. . |
| 4,949,783 | 8/1990 | Lakios et al. . |
| 5,033,538 | 7/1991 | Wagner et al. . |
| 5,113,929 | 5/1992 | Nakagawa et al. . |
| 5,131,460 | 7/1992 | Krueger . |
| 5,180,000 | 1/1993 | Wagner et al. ............... 165/80.1 |
| 5,199,483 | 4/1993 | Bahng ......................... 165/80.1 X |
| 5,228,501 | 7/1993 | Tepman et al. . |
| 5,267,607 | 12/1993 | Wada . |
| 5,281,320 | 1/1994 | Turner et al. . |
| 5,307,709 | 5/1994 | Kobayashi . |
| 5,326,725 | 7/1994 | Sherstinsky et al. ........ 118/728 X |
| 5,382,311 | 1/1995 | Ishikawa et al. ............. 156/345 |
| 5,421,401 | 6/1995 | Sherstinsky et al. . |
| 5,427,670 | 6/1995 | Baggerman et al. ......... 156/345 X |
| 5,446,824 | 8/1995 | Moslehi . |

FOREIGN PATENT DOCUMENTS 6-148111  8/1985  Japan .

*Primary Examiner*—Leonard R. Leo
*Attorney, Agent, or Firm*—Thomason & Moser

[57] ABSTRACT

Apparatus and a concomitant method of supporting a substrate while providing effective backside cooling for the substrate. The apparatus comprises a platen having support pins, attached to the platen, for supporting a substrate in a spaced apart relation to the platen. The support pins cause a gap to be formed between the substrate and the platen. The platen contains at least one heat transfer medium supply portal that passes through the platen to supply a heat transfer medium to the gap between the substrate and platen. Lastly, the apparatus contains a flow control assembly, located proximate the peripheral edge of the substrate, for controlling the flow of the heat transfer medium through the gap between the platen and the substrate.

15 Claims, 2 Drawing Sheets

FROM
HEAT
TRANSFER
MEDIUM
SUPPLY

APPARATUS AND METHOD FOR COOLING A SUBSTRATE

BACKGROUND OF THE DISCLOSURE

1. Field of the Invention

The invention relates to semiconductor processing systems and, more particularly, to apparatus and methods for cooling a substrate within a semiconductor processing system.

2. Description of the Background Art

Within a semiconductor wafer processing system, the wafer (also referred to in the art as a substrate) is supported within a processing chamber by a substrate support (also known in the art as a wafer pedestal or susceptor). During some processes, such as high power physical vapor deposition (PVD), the wafer becomes extremely hot and could be damaged without apparatus for cooling the wafer being imbedded within the substrate support. For example, commonly assigned U.S. Pat. No. 5,199,483, issued Apr. 6, 1993, discloses a method and apparatus for cooling a wafer by applying a cooling gas between the wafer and the pedestal. This is a cooling technique known in art as "backside cooling". Without a backside cooling gas, the interstices between the substrate support and the substrate are filled with the chamber atmosphere, e.g., a vacuum or partial vacuum. As such, heat conduction from the substrate to the support is limited to points of physical contact between the substrate and the substrate support. Since, on a microscopic level, the substrate is not flat, the points of contact between the substrate and the substrate support are few and, as such, do not provide substantial heat conduction.

In a backside cooling technique, the gas is typically applied to the wafer backside, i.e., the surface of the wafer that rests upon the substrate support, via a plurality of portals through the substrate support. The gas penetrates the microscopic interstices between the support surface and the backside of the wafer. As such, the gas promotes conduction of heat from the wafer and into the substrate support. Over time, the gas generally escapes from the underside of the wafer into the chamber atmosphere. One disadvantage of this form of backside cooling is that the escape of the cooling gas into the process chamber can impede wafer processing.

To reduce the amount of escaped gas and to firmly retain the wafer upon the substrate support, some processing systems utilize a peripheral clamping mechanism. While the backside cooling gas is applied between the substrate and the substrate support, the clamping mechanism securely presses the peripheral edge of the wafer against the surface of the substrate support. Commonly assigned U.S. Pat. No. 5,228,501, issued Jul. 20, 1993, discloses a mechanical clamping mechanism that uses backside cooling.

Modern semiconductor devices, especially for use in communications systems, are fabricated on very thin semiconductor wafers, e.g., approximately five mils thick. Such wafers are five times thinner than a typical semiconductor wafer. These thin wafers are typically used in the communications industry for cellular telephone electronics, e.g., for fabrication of high-power, radio frequency transmitter electronics. In such a use, the thinner the semiconductor wafer, the more efficiently heat can be transferred away from the integrated circuit. To facilitate such heat transfer, one side of the circuitry is typically coated with a layer of thermally conductive material such as gold. This material is deposited during device fabrication using a PVD process. However, the PVD process can impose a significant thermal strain upon the thin wafer.

To combat the thermal strain, backside cooling is used as well as attempting to deposit thick layers of material over short durations. However, to shorten the deposition duration, higher power PVD systems must be used which generally cause higher temperatures in the wafer, but over a shorter period of time. To reduce the average temperature attained by the wafer, the deposition is limited to a short amount of time. However, such short duration deposition periods result in a thinly deposited layer.

Backside cooling aids in reducing the temperature of the wafer during deposition; however, under normal backside gas pressures (e.g., approximately 10 Torr) a thin wafer would bow as much as 3.05 cm (1.2 inches) and would certainly fracture well before that much displacement had occurred. As such, to process the thin wafers, very low backside gas pressure is used (e.g., 1 Torr) which bows the wafer only about 0.305 cm (0.12 inches). Although the thermal transfer efficiency is significantly reduced when using such low pressures, at least the wafer is intact after processing.

Consequently, to process the thin wafers, the power used for the deposition, the duration of the deposition and the backside gas pressure must be controlled to ensure that the temperature of the wafer does not exceed the eutectic temperature of the wafer material and the deposition species causing interdiffusion of the two materials. If such interdiffusion occurs, the deposited layer may become pitted and unevenly deposited.

Therefore, there is a need in the art for apparatus and a method which provides support for a thin wafer as well as effective backside cooling.

SUMMARY OF THE INVENTION

The disadvantages associated with the prior art in supporting and cooling substrates during substrate processing are overcome by the present invention. Specifically, the present invention is apparatus and a concomitant method of supporting a substrate while effectively cooling the substrate. The apparatus comprises a platen having support buttons, attached to the platen, for supporting a substrate in a spaced apart relation to the platen. The support buttons cause a gap to be formed between the substrate and the platen. The platen contains at least one heat transfer medium supply portal that passes through the platen to supply a heat transfer medium to the gap between the substrate and platen. Lastly, the inventive apparatus contains a flow control assembly, located proximate the peripheral edge of the substrate, for controlling the flow of the heat transfer medium through the gap between the platen and the substrate. The flow control assembly contains a labyrinth channel extending from the peripheral edge of the substrate. The channel facilitates heat transfer coolant flow beneath substantially the entire backside of the substrate. To increase the flow volume of the heat transfer medium, the flow control assembly may also contain outlet portals through the platen.

The controlled flow of the heat transfer medium promotes conductive heat transfer as well as convective heat transfer from the substrate to the platen and/or the medium. The platen is typically cooled by a heat transfer fluid such as water that flows through cooling jackets internal to the platen. By facilitating both convection and conduction of heat from substantially the entire underside area of the substrate, sufficient heat conduction is achieved at low backside gas pressures to allow for processing of thin substrates. As such, thin wafers can be processed without the possibility that the backside gas pressure needed to cool the wafer would fracture the wafer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention is a wafer support platform that supports a substrate such that a heat transfer medium (e.g., a coolant gas such as argon) flows beneath the substrate. The invention ensures that the medium contacts substantially the entire underside area of the substrate. The platform also controls the flow of the heat transfer medium such that a thin substrate will not significantly bow as it is cooled with a backside coolant. Consequently, the flow of coolant gas beneath the substrate facilitates both convective and conductive cooling of the substrate.

Figure 1:
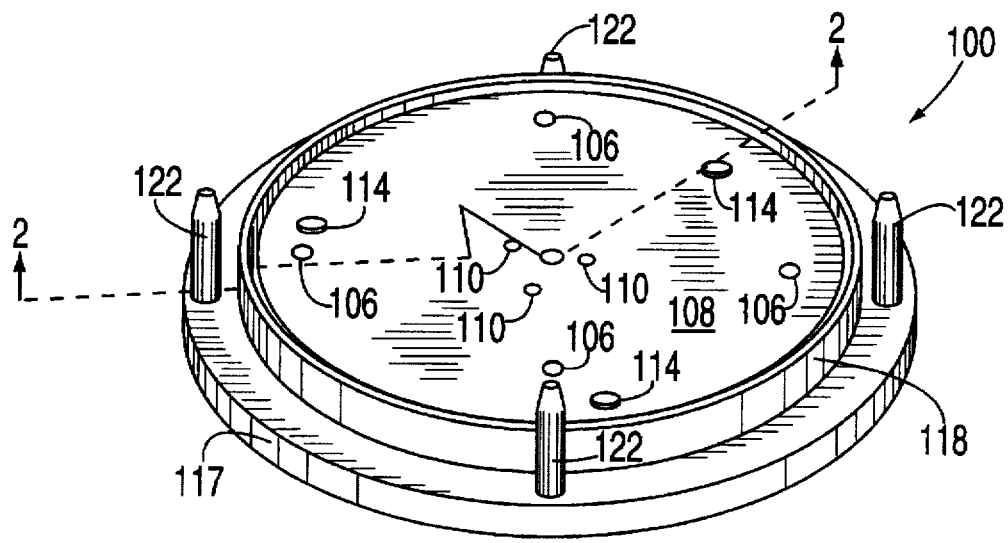
FIG. 1 depicts a perspective view of a substrate support platform in accordance with the present invention.
Figure 2:
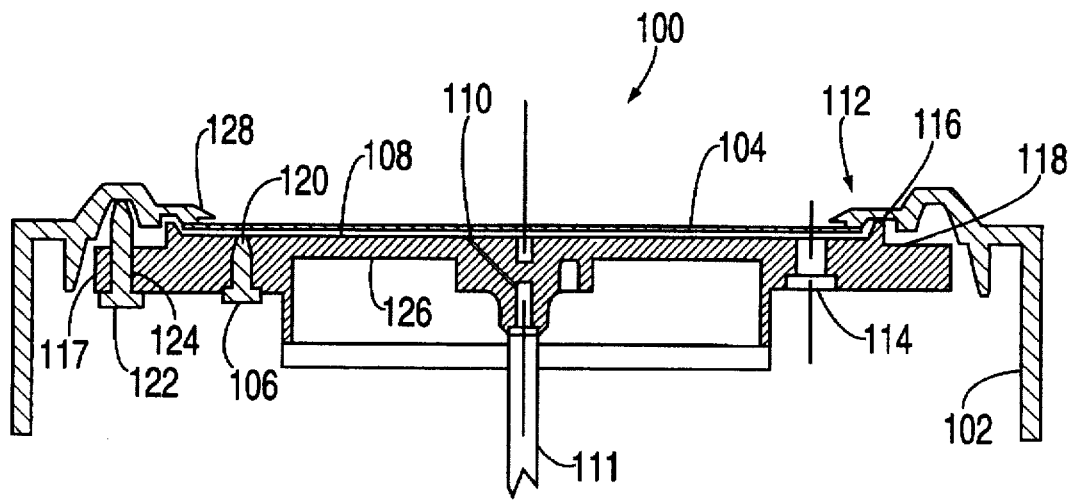
FIG. 2 depicts a cross-sectional view of the substrate support platform of FIG. 1 taken along line 2—2 as well as a substrate and a cover ring.

FIG. 1 depicts a perspective view of the wafer support platform 100 of the present invention. FIG. 2 depicts a cross-sectional view of the wafer support platform 100 taken along line 2—2 of FIG. 1. FIG. 2 also depicts a cover ring 102 forming an additional component of the platform 100 as it is used to support a substrate 104. To best understand the invention, the reader should simultaneously consult FIGS. 1 and 2.

Specifically, the platform 100 contains a plurality of support pins (or buttons) 106—106 for supporting the substrate 104 above a platen 108. Typically, there are four support pins 106—106 evenly distributed near the outer periphery of the platen 108. The pins protrude from the platen surface by approximately 0.508 mm (0.020 inches). As such, the substrate 104 is supported above the platen surface to form a gap therebetween.

The platen 108 contains one or more heat transfer medium supply portals 110—110 that carry a heat transfer medium such as argon from a supply conduit 111, through the platen 108, to the backside of the substrate 104. Typically, the platen contains three portals 110—110 having a diameter of 0.157 mm (0.062 inches). The peripheral edge of the substrate is retained by the cover ring 102. Details of the cover ring are disclosed below and in commonly assigned U.S. patent application Ser. No. 08/564,398, filed Nov. 29, 1995, entitled "Semiconductor Wafer Alignment Member and Clamp Ring" and incorporated herein by reference.

The flow of the heat transfer medium and, importantly, the pressure that the medium places on the backside of the substrate is controlled by a flow control assembly 112. The flow control assembly contains a labyrinth channel 116 located about the periphery of the substrate 104. To provide added flow volume for the coolant gas, the flow control assembly may also include outlet portals 114—114 located in the platen 108. The outlet portals 114—114 typically have a dual purpose: the portals are substrate lift pin access holes as well as the outlet portals. Additional outlet portals can be drilled into the platen as needed to increase the flow volume.

The diameter of the outlet portals is determined by the backside gas pressure that is desired. Typically, for a gas pressure of approximately 1 Torr, the holes are 0.635 cm (0.25 inches) in diameter. In addition, the labyrinth channel 116, operating in conjunction with the outlet portals, determines the backside gas pressure. Therefore, to achieve a particular backside gas pressure, the channel diameter must be kept in mind when defining the outlet portal diameter.

The labyrinth channel 116 is defined by a gap between the substrate 104 and the platen 108 as well as a gap between the cover ring 102 and a centering protrusion 118. The gap between the substrate and the platen is established by the plurality of support pins or buttons 106—106 that extend from the platen 108. In the preferred embodiment, the platen 108 contains a plurality of threaded holes 120 into which the support pins 106 are threaded. The pins extend from the platen by approximately 0.508 mm (0.020 inches). The height of the gap can be adjusted depending upon the desired backside gas pressure. As an alternative method of establishing the support pins, the pins may be integrally formed into the surface of the platen by milling the platen's surface.

The gap between the cover ring 102 and the centering protrusion 118 is defined by the height of the cover ring alignment pins 122—122 that support the cover ring. The alignment pins (typically, four alignment pins are used) are threaded into holes 124 that are evenly distributed along the outer edge 117 of the platen 108. The alignment pins 122—122 extend above the platen 108 and support the cover ring 102 such that the gap between the centering protrusion and the cover ring is approximately 0.254 mm (0.010 inches). The centering protrusion has a height above the platen surface of approximately 4.6 mm (0.18 inches). The sloped inner surface 128 is sloped at 30 degrees relative to vertical.

The dimensions recited above (e.g., a substrate to platen gap of 0.508 mm (0.020 inches), three outlet portals each having a diameter of 0.635 cm (0.25 inches),and a labyrinth channel dimension of 0.254 mm (0.010 inches)) provide a 1 Torr backside gas pressure when the gas is argon and the thin substrate has a diameter of 15.24 cm (6 inches). Further details of the labyrinth channel are provided with respect to FIG. 3.

The heat is transferred away from the substrate through two mechanisms: (1) heat conduction across the gap between the substrate and platen and (2) heat convection as the gas flows beneath the substrate from the centrally located supply portals 110 towards the outlet portals 106 and the labyrinth channel 116. To promote heat conduction, the platen is typically cooled to 10 to 20 degrees Celsius by coolant jackets (not shown) embedded within the platen or attached to the bottom surface 126 of the platen 108. The coolant jackets typically carry a heat transfer liquid such as water.

Figure 3:
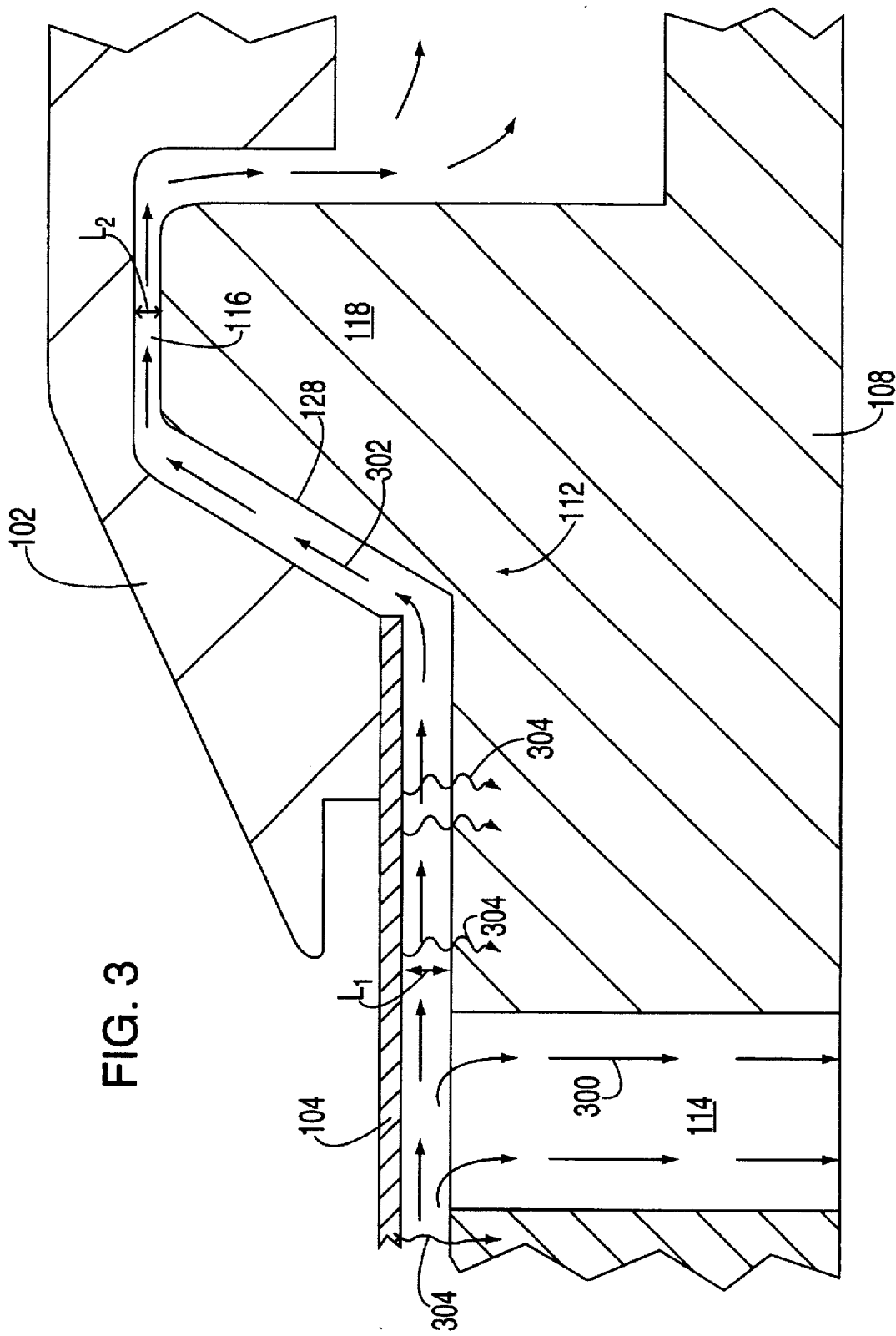
FIG. 3 depicts a detailed cross-sectional view of the flow control assembly of FIG. 2.

FIG. 3 depicts a cross-sectional view of the flow control assembly 112 including an indication of the gas flow directions through one of the outlet portals 114 and the labyrinth channel 112. The gas flow direction through the portal 114 is indicated by arrows 300, while the gas flow direction through the labyrinth channel 112 is indicated by reference arrows 302. Arrows 300 and 302 also indicate heat flow due to convection. Arrows 304 indicate the heat flow direction due to conduction.

The gap between the substrate and the surface of the platen 108 is shown as dimension $L_1$ (typically, 0.508 mm) This gap dimension is maintained between the cover ring and the sloped surface 306 of the centering protrusion 118.

The gas flow is restricted at the top of the centering protrusion, where the gap dimension is shown as $L_2$ (typically, 0.254 mm). Using this form of flow control assembly ensures that a constant, well regulated gas flow propagates beneath substantially the entire backside surface of the substrate. Additionally, the peripheral flow control assembly also ensures limited leakage of coolant gas into the processing chamber. Specifically, the cover ring seals the region above the substrate (e.g., the process region) from the region beneath the substrate support platform. The cover ring ensures that the deposition species within the process region do not enter the region beneath the platform as well as ensuring that the coolant gas does not enter the process region. A detailed description of utilizing a cover ring to prevent the deposition species from entering the region below the platform is provided in commonly assigned U.S. patent application Ser. No. 08/461,575, filed Jul. 2, 1995, entitled "Apparatus for Full Wafer Deposition" and incorporated herein by reference. Also, the cover ring as applied to "thin" wafers is disclosed in commonly assigned U.S. patent application Ser. No. 08/564,398, filed Nov. 29, 1995, entitled "Semiconductor Wafer Alignment Member and Clamp Ring" and incorporated herein by reference.

By simply selecting an appropriate gas flow rate to cool the substrate during a particular process, then defining gap dimension $L_1$ and $L_2$ that achieve that gas flow rate without substantial wafer bowing, the invention achieves backside cooling without risk of fracturing the substrate with excessive backside gas pressure. The gaps are generally adjustable by replacing the support pins and the alignment pins with pins having different lengths. However, spacers may be placed between the pin heads and the bottom surface of the platen to adjust the height of the pin relative to the platen's upper surface.

The flow control assembly depicted in FIGS. 2 and 3 is intended to be illustrative. Those skilled in the art will realize that the invention encompasses other forms of backside gas flow control assemblies. One such alternative assembly would conventionally clamp the substrate along its peripheral edge and provide a plurality of portals or channels along the periphery of the substrate to channel the coolant gas away from the substrate.

Although various embodiments which incorporate the teachings of the present invention have been shown and described in detail herein, those skilled in the art can readily devise many other varied embodiments that still incorporate these teachings.

What is claimed is:

1. Apparatus for supporting a substrate comprising:
   a platen;
   a support element, attached to said platen, for supporting said substrate in a spaced apart relation to said platen where a first gap is formed between said substrate and said platen;
   a heat transfer medium supply portal, passing through said platen, for supplying a heat transfer medium to said first gap; and
   a flow control assembly, located proximate a peripheral edge of the substrate, for controlling the flow of the heat transfer medium through the first gap, where said flow control assembly contains a second gap, defined between said platen and a cover ring, for exhausting the heat transfer medium from the first gap.

2. The apparatus of claim 1 wherein said support element comprises a plurality of support pins protruding from said platen to support said substrate.

3. The apparatus of claim 1 wherein said flow control assembly comprises a plurality of outlet portals formed through the platen.

4. The apparatus of claim 3 wherein said outlet portals are substrate lift pin access holes.

5. The apparatus of claim 1 wherein said second gap is a labyrinth channel.

6. The apparatus of claim 1 wherein said cover ring is supported above said platen by a plurality of alignment pins to form said second gap between said platen and said cover ring.

7. The apparatus of claim 1 wherein said flow control assembly further comprises a plurality of outlet portals formed through the platen for exhausting the heat transfer medium from the first gap.

8. The apparatus of claim 7 wherein said outlet portals are substrate lift pin access holes.

9. The apparatus of claim 7 wherein said cover ring is supported above said platen by a plurality of alignment pins.

10. A method for transferring heat from a substrate comprising the steps of:
    supporting the substrate in spaced apart relation to a platen to form a first gap between said substrate and said platen;
    supplying a heat transfer medium to the first gap; and
    exhausting the heat transfer medium from a periphery of the substrate through a flow control assembly, where said flow control assembly contains a second gap, defined between said platen and a cover ring, for exhausting the heat transfer medium from the first gap.

11. The method of claim 10 wherein said second gap is a labyrinth channel.

12. The method of claim 10 wherein said flow control assembly comprises an outlet portal formed through the platen for exhausting the heat transfer medium from the first gap through the platen.

13. The method of claim 10 further comprising the step of supporting the cover ring above said platen with a plurality of alignment pins to form said second gap between said platen and said cover ring.

14. Apparatus for supporting a substrate comprising:
    a platen;
    a plurality of support pins, protruding from said platen, for supporting said substrate in a spaced apart relation to said platen where a first gap is formed between said substrate and said platen;
    a heat transfer medium supply portal, passing through said platen, for supplying a heat transfer medium to said first gap;
    a cover ring, supported above said platen by a plurality of alignment pins, for forming a second gap between said platen and said cover ring as a portion of a labyrinth channel for exhausting the heat transfer medium from the first gap;
    a plurality of outlet portals through the platen for exhausting the heat transfer medium from the first gap.

15. The apparatus of claim 14 wherein said outlet portals are substrate lift pin access holes.

* * * * *